(12) United States Patent
Kim et al.

(10) Patent No.: US 6,919,149 B2
(45) Date of Patent: Jul. 19, 2005

(54) WAVE GUIDED ALTERNATING PHASE SHIFT MASK AND FABRICATION METHOD THEREOF

(75) Inventors: Seong-hyuck Kim, Seoul (KR); Tae-moon Jeong, Kyungki-Do (KR); In-kyun Shin, Kyungki-Do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 272 days.

(21) Appl. No.: 10/414,217

(22) Filed: Apr. 16, 2003

(65) Prior Publication Data
US 2003/0198875 A1 Oct. 23, 2003

(30) Foreign Application Priority Data
Apr. 19, 2002 (KR) .................. 10-2002-0021681

(51) Int. Cl.[7] .................................. G01F 9/00
(52) U.S. Cl. ........................................ 430/5
(58) Field of Search .............................. 430/5, 311, 394

(56) References Cited

U.S. PATENT DOCUMENTS 5,932,378 A * 8/1999 Lee ................................ 430/5

FOREIGN PATENT DOCUMENTS

KR 1999-0065307 8/1999

* cited by examiner

Primary Examiner—S. Rosasco
(74) Attorney, Agent, or Firm—Volentine Francos & Whitt, PLLC

(57) ABSTRACT

A wave guided alternating phase shift mask (WGAPSM) includes a substrate transparent to light from an exposure light source and a waveguide pattern formed on the substrate to define a plurality of transparent regions that are regularly arranged. The transparent regions defined by the waveguide pattern include a plurality of shift transparent regions formed of recess regions of the substrate and a plurality of non-shift transparent regions alternatively arranged with the shift transparent regions. The provided WGAPSM minimizes an error of critical dimension difference and an X-effect while securing a large process margin and not generating opaque defects. A fabricating method for the provided WGAPSM is also provided.

16 Claims, 7 Drawing Sheets

WAVE GUIDED ALTERNATING PHASE SHIFT MASK AND FABRICATION METHOD THEREOF

CROSS REFERENCES TO RELATED APPLICATIONS

This application claims priority under 35 U.S.C. § 119 from Korean Patent Application No. 2002-21681, filed on Apr. 19, 2002, the contents of which are hereby incorporated by reference as their entirety as if fully set forth herein.

BACKGROUND AND SUMMARY

1. Technical Field

The present invention relates to an alternating phase shift mask (PSM) used for fabricating semiconductor devices and a fabricating method of the same, and more particularly, to a wave guided alternating phase shift mask (WGAPSM) and a fabricating method of the same.

2. Description

Semiconductor devices having storage capacities of more than gigabits require a pattern with a design rule of less than submicron size. However, as the pattern size is reduced, a proximity effect occurs between adjacent patterns, lowering pattern resolution. In order to prevent the reduction of the pattern resolution, a phase shift mask (PSM) has been used which shifts the phase of a beam passing the mask to destructively interfere.

FIG. 1 is a sectional view of a conventional alternating PSM, and FIG. 2 is a graph of a substantial distribution of beam intensity when the PSM of FIG. 1 is used.

With reference to FIG. 1, an alternating PSM 10 includes a mask substrate 12, for example, a quartz substrate, on which an opaque pattern 14, for example, a chrome pattern, is formed to define a plurality of transparent regions A and B. The transparent regions A and B are formed of non-shift regions A, which do not shift the phase of incident beams, and shift regions B, which are formed by etching the substrate 10 for a predetermined depth to shift the phase of the incident beams. The beams passed through the non-shift regions A and the shift regions B have opposite phases and destructively interfere each other, so that the resolution of patterns, which are transcribed from the mask, is improved. Here, the intensity of the beams, which have passed the PSM, should be uniform at the non-shift regions A and the shift regions B. However, the intensity of the beams $I_B$ in the shift regions B is substantially lower than the intensity of the beams $I_A$ in the non-shift regions A, because the shift-regions B are formed by etching the substrate 12. When the beam passes through the shift-regions B that have defects on the surfaces of the substrate 12 due to the etching, the beam is scattered, thereby reducing the intensity of the beam. Specifically, the scatter of the beam at the rectangular corners of the shift-regions B mainly reduces the intensity of the beam. The difference in intensities generates an error CD of a critical dimension (CD) difference between adjacent patterns transcribed on a wafer. In addition, even if the error CD does not occur, an X-effect where the CD is reversed according to focus occurs when the beams fail to form a proper phase difference, such as 180 degrees, such as the case of FIG. 2 where defocus is 0.3 μm.

To solve the above problem, with reference to FIG. 3, another conventional alternating PSM 10' forms preliminary shift regions B' by etching portions of a substrate 12 on which an opaque pattern 14 is formed to set the phase of beams, which pass through the preliminary shift regions B', to less than 180 degrees. Then, referring to FIG. 4, an isotropic etching process is performed to form shift regions B" of undercut shape. Thus, the alternating PSM 10' is completed as shown in FIG. 4. The main reason for scatter of the beam is overcome by the undercut, thereby preventing reduction of the intensity of the beam.

However, in the conventional alternating PSM 10', chipping 16 in which portions of the opaque pattern 14 that are not being supported by the substrate 12, may break off, and the broken pieces of the opaque pattern 14 may operate as opaque defects 18. Moreover, as the pattern size is reduced, the margin for a wet etching process is reduced and the chipping is more likely to happen. Furthermore, since the etching amount is adjusted by controlling the wet etching process without using an etch stopper, a phase adjustment margin becomes very small.

To solve the above-described problems, it would be desirable to provide a wave guided alternating phase shift mask (PSM) to efficiently reduce an error CD and an X-effect, to avoid generating opaque defects in fabricating the PSM, and to secure a large phase margin.

It would also be desirable to provide a method of fabricating a wave guided alternating PSM.

In one aspect of the present invention, a wave guided alternating PSM (WGAPSM) that has a waveguide pattern for defining a transparent region is provided. The waveguide pattern is formed on the substrate to define a plurality of transparent regions that are regularly arranged. The transparent regions defined by the waveguide pattern include shift transparent regions formed of recess regions, and non-shift transparent regions alternatively arranged with the shift transparent regions.

The thickness of the waveguide pattern is preferably determined to guide the high order (i.e., having an order $\leq -2$ and $\geq +2$) Fourier components of wavefronts, which pass through the shift transparent regions, at least once, and more preferably, exactly once. The thickness is determined by a function depending on two independent variables, i.e., the wavelength of the exposure light source and the pitch size of the waveguide pattern, and the depth of the recess regions is determined by an equation of depth={wavelength of the exposure light source used for the mask/[2*(the refractive index of the substrate −1)]}.

It is more preferable that the wavelength of the exposure light source is less than 248 nm, the pitch size of the waveguide pattern is less than 1120 nm, and the thickness of the waveguide pattern is 4400 to 4600 Å.

It is preferable that the waveguide pattern is formed of a material having a transmittance of over 0% and less than 30% for the exposure light source.

It is preferable that the waveguide pattern defines a line and space pattern or an opening pattern in a cell array region of a semiconductor memory device.

In another aspect of the present invention, a fabricating method of a WGAPSM is provided. According to the fabricating method, a material layer for a waveguide pattern is formed on a substrate that is transparent to the light from an exposure light source. Thereafter, the waveguide pattern for defining a plurality of transparent regions is formed by patterning the material layer, and a resist pattern for exposing the transparent regions to be shift transparent regions is formed on the substrate. Next, the substrate is etched by using the resist pattern and the waveguide pattern as etch masks to form recess regions, so as to complete a plurality of shift transparent regions formed of the recess regions and a plurality of non-shift transparent regions alternatively arranged with the shift transparent regions.

Here, the thickness of the material layer is selected so to guide the higher order (i.e., ±2nd order; ±3rd order; ±4th order, etc.) Fourier components of wavefronts, which pass through the shift transparent regions, at least once, and preferably, exactly once.

BRIEF DESCRIPTION OF THE DRAWINGS

The above objectives and advantages of the present invention will become more apparent by describing in detail preferred embodiments thereof with reference to the attached drawings in which.

DETAILED DESCRIPTION

Figure 1:
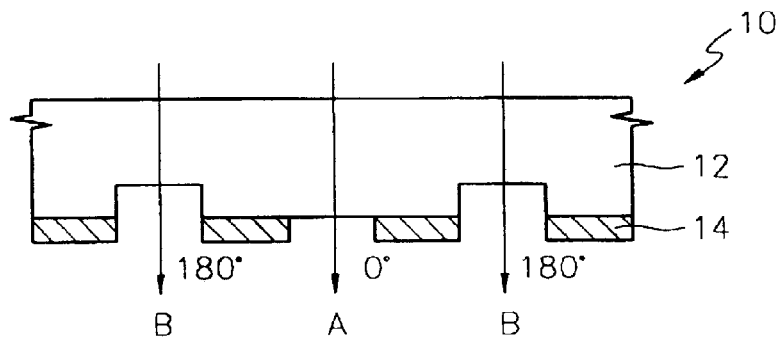
FIG. 1 is a sectional view of an alternating phase shift mask (PSM)
Figure 2:
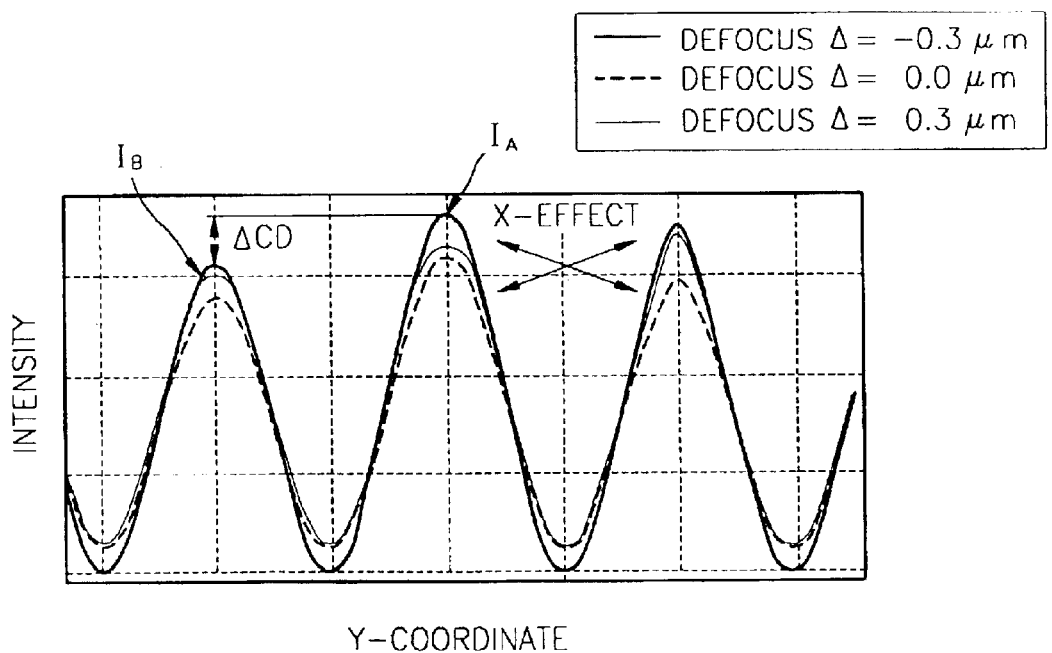
FIG. 2 is a graph of a substantial distribution of intensity of beams when the alternating PSM of FIG. 1 is used.
Figure 3:
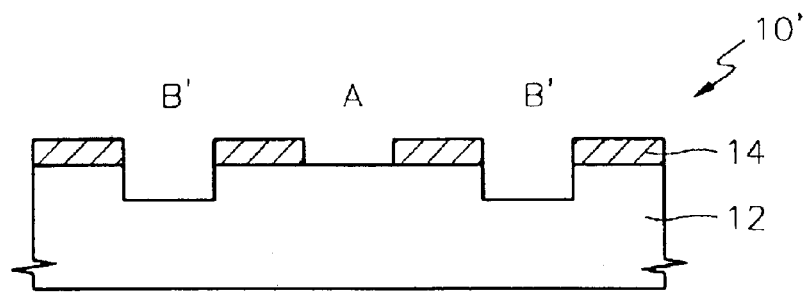
FIGS. 3 and 4 are sectional views illustrating methods of fabricating alternating PSMs.
Figure 4:
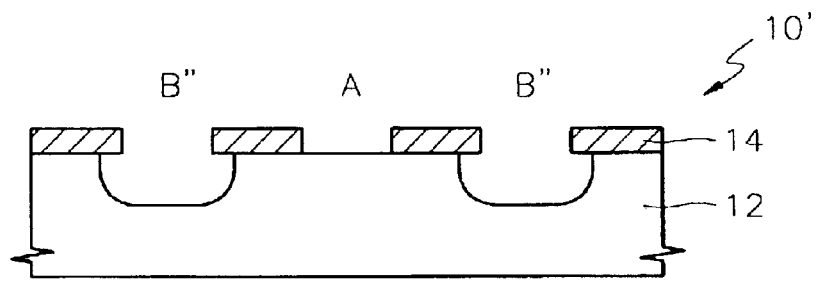
Figure 5:
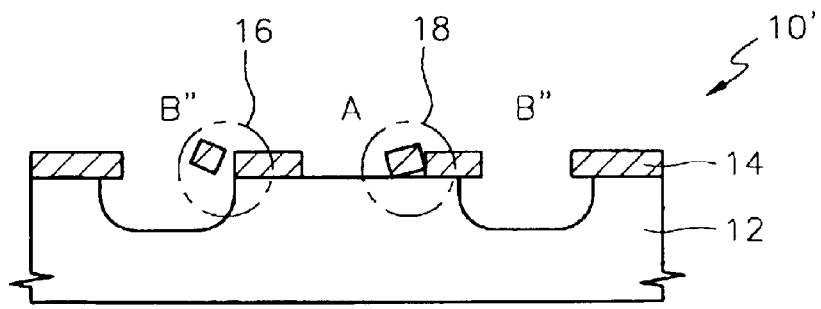
FIG. 5 is a sectional view illustrating problems in fabricating and using the alternating PSM of FIG. 4.

The present invention will now be described more fully with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and compete, and will fully convey the concept of the invention to those skilled in the art. In the drawings, the thickness and the size of transparent regions and patterns are exaggerated for clarity. The same reference numerals in different drawings represent the same elements.

Figure 6:
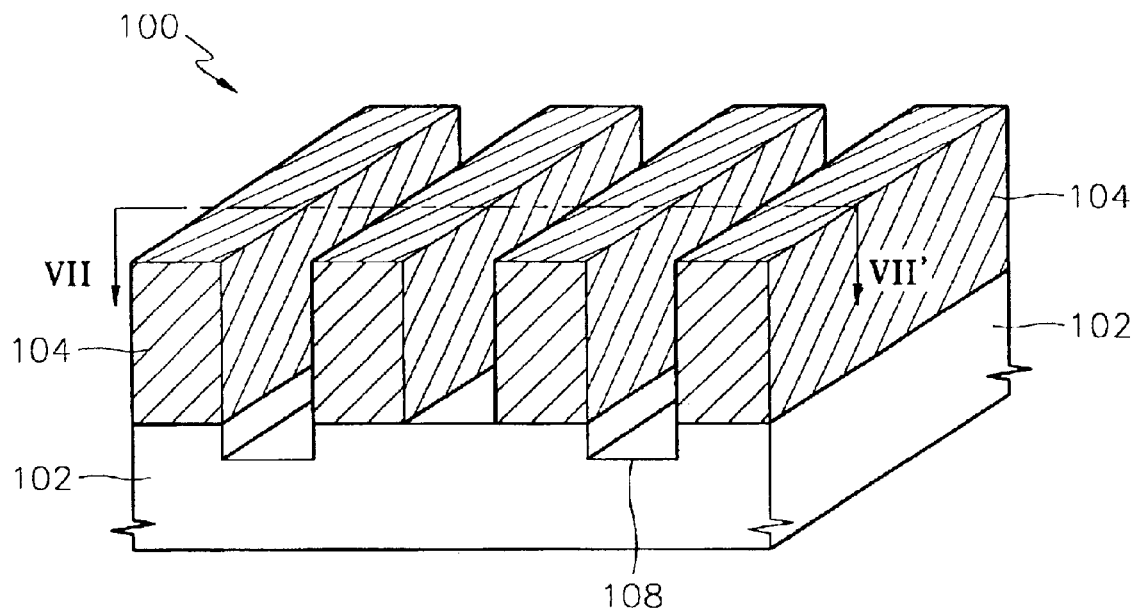
FIG. 6 is a partial perspective view of a first embodiment of a wave guided alternating PSM (WGAPSM)
Figure 7:
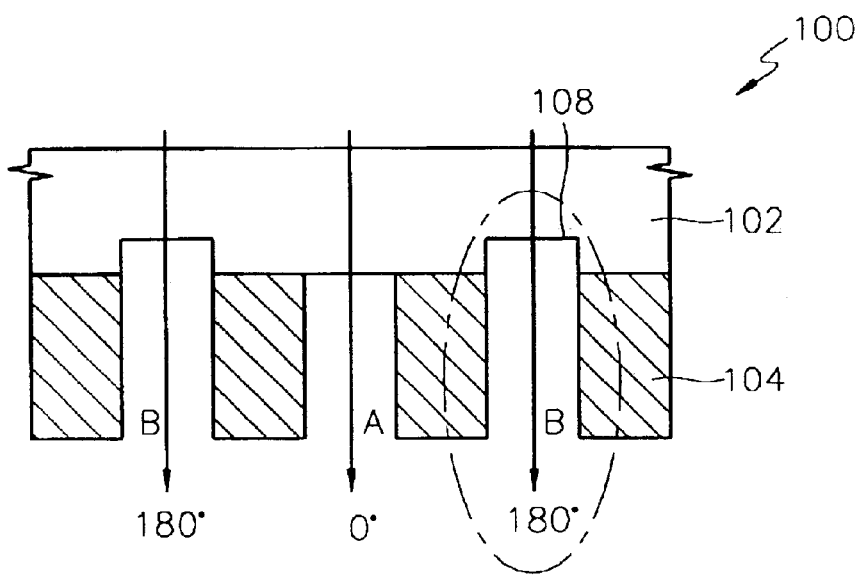
FIG. 7 is a sectional view of the WGAPSM of FIG. 6.

FIG. 6 is a partial perspective view of a wave guided alternating phase shift mask (WGAPSM) having a waveguide pattern 104 for defining a transparent region. FIG. 7 is a sectional view of the mask of FIG. 6, taken along the cutting plane line VII–VII', and FIG. 8 is a partial enlarged view of the mask of FIG. 7.

Figure 8:
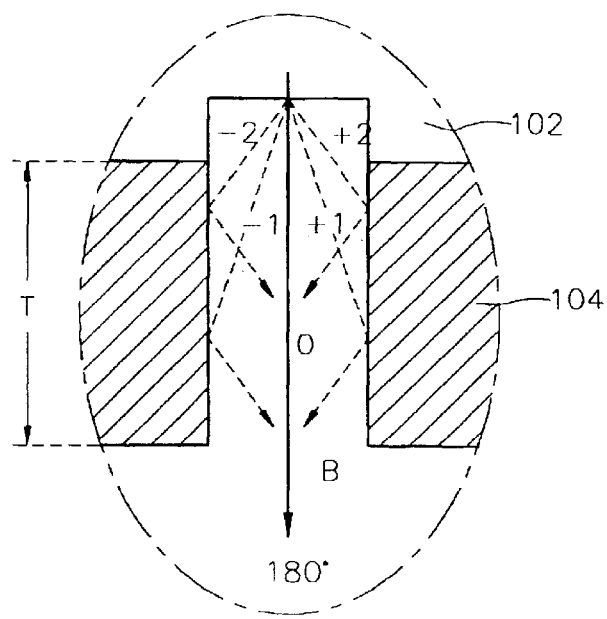
FIG. 8 is a partial enlarged view of the WGAPSM of FIG. 7.

Referring to FIGS. 6 through 8, the waveguide pattern 104 is formed on a substrate 102 that is transparent to light from an exposure light source to define a plurality of transparent regions A and B that are regularly arranged. Here, the transparent regions B which are shift regions are formed of recess regions 108, and transparent regions A which are non-shift regions are alternatively arranged with the shift transparent regions B.

It is preferable that the substrate 102 that is transparent to the light from the exposure light source is a quartz substrate.

The shift transparent regions B are formed of the recess regions 108, which are formed by etching the substrate 102 for a depth of shifting the phase of beams passing through the shift transparent regions B. The depth of the recess (regions 108 is, for example, depth={wavelength of the exposure light source used for the mask/[2*(the refractive index of the substrate−1)]}.

The waveguide pattern 104 balances the strengths of the beams passed through the non-shift transparent regions A and the shift transparent regions B. More specifically, as shown in FIG. 8, wavefronts that pass through the shift transparent regions B, which are formed of the recess regions 108, have a large amount of primary and secondary Fourier components.

The light beam may be considered as having lower order (i.e., the zero and ±1st order) Fourier components, and higher order (i.e., ±2nd order, ±3rd order, ±4th order, etc.) Fourier components. The waveguide pattern 104 guides the higher order Fourier components to balance the intensities of the beams passed through the shift transparent regions B with the intensities of the beams passed through the non-shift transparent regions A. Accordingly, it is preferable that the thickness "T" of the waveguide pattern 104 is selected so as to guide the high order Fourier components of the wavefronts, which pass through the shift transparent regions B, at least once. In this case, since reducing the thickness of the waveguide pattern 104 is advantageous in the fabrication process and reduces the cost of the mask 100, it is most preferable that the thickness of the waveguide pattern 104 is selected to guide the high order Fourier components exactly once.

As the wavelength of the exposure light source is reduced, the diffraction angle of the exposure light source decreases, whereas, as the pitch of the waveguide pattern 104 is decreased, the diffraction angle increases. Therefore, the thickness T of the waveguide pattern 104 can be determined by a function depending on two variables, for example, T=f(X, Y), wherein the wavelength X of the exposure light source and the pitch size Y of the waveguide pattern 104 are independent variables.

When an exposure light source having a wavelength of under 248 nm is used while using the quartz substrate 102, the depth of the recess regions 108 is less than 1000 Å. When the pitch of the pattern to be transcribed to a wafer is 280 nm while forming a mask that will be used in a ¼-scale stepper, the pitch size of the waveguide pattern is 280×4 nm. As a result, it is preferable that the thickness of the waveguide pattern 104 is 4400 to 4600 Å, considering the above function.

It is preferable that the waveguide pattern 104 is formed of a material having transmittance of over 0% and less than 30% for the exposure light source to improve the resolution of the pattern. Examples of such a material include chrome (Cr), aluminum (Al), molybdenum silicide (MoSi), and chrome oxide (CrOx).

Figure 9:
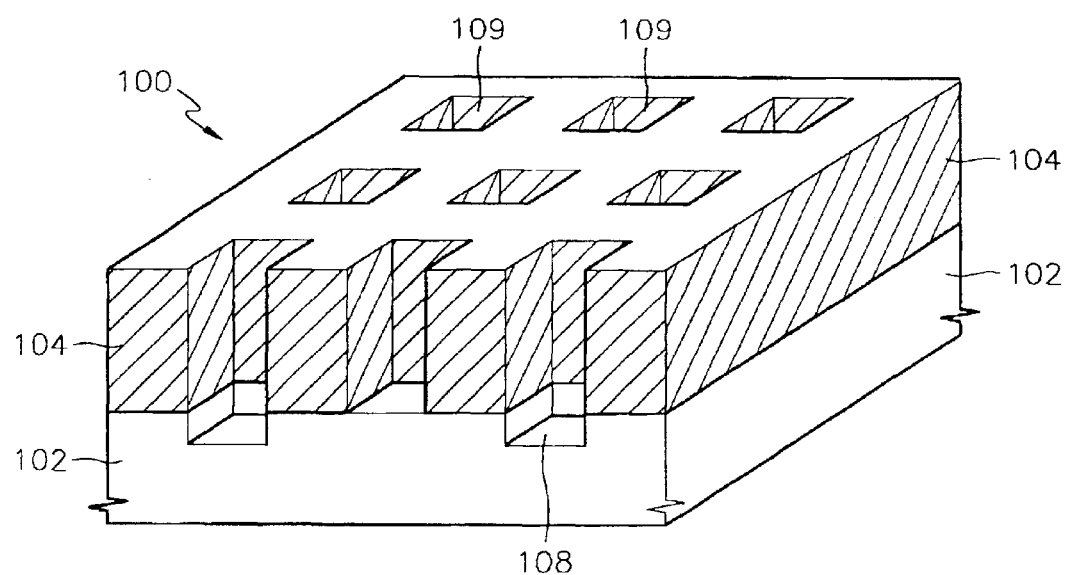
FIG. 9 is a partial perspective view of a second embodiment of a WGAPSM.

The mask shown in FIGS. 6 through 8 defines a line and space pattern, in particular defines a highly integrated pattern, such as the line and space pattern in the cell array region of a semiconductor memory device. Meanwhile, a WGAPSM according to a second embodiment is a mask that defines a plurality of openings 109 in the cell array region of a semiconductor memory device, as shown in FIG. 9.

Figure 10:
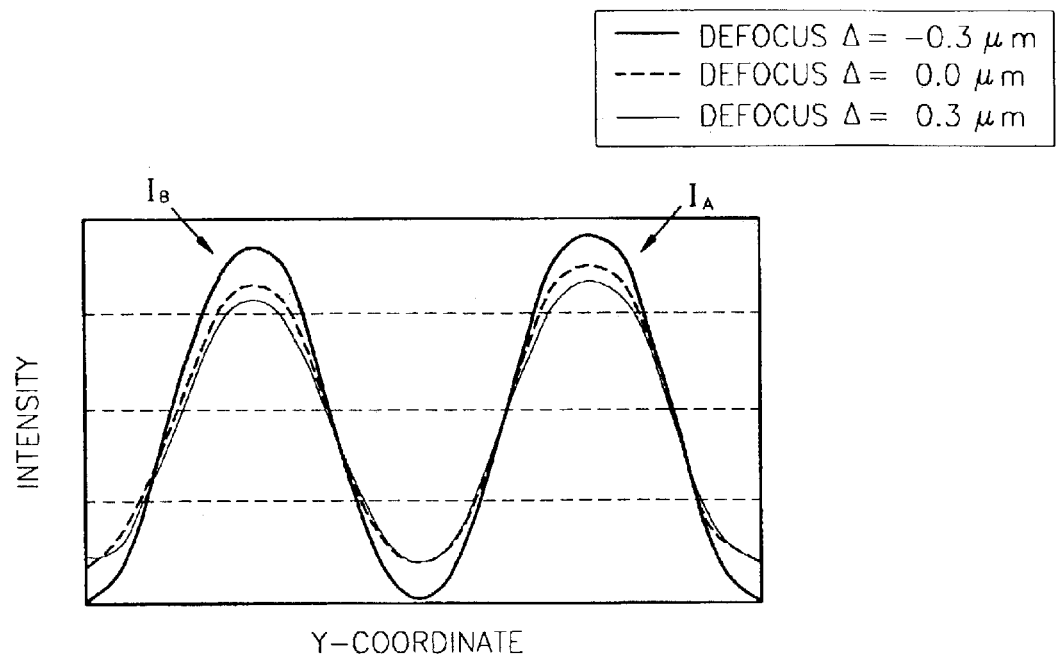
FIGS. 10 and 11 are graphs of distributions of intensities of beams when using the WGAPSM of FIGS. 6–8 and the alternating PSM of FIG. 1.
Figure 11:
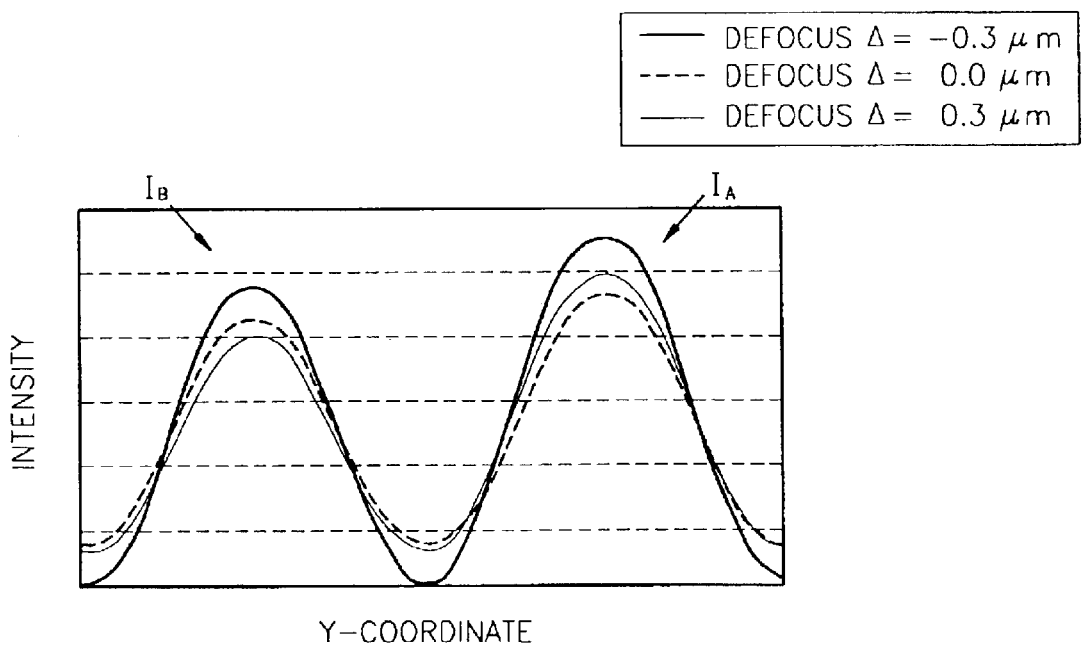

FIG. 10 is a graph of the distribution of the intensity of a light beam for the case where the WGAPSM having the waveguide pattern with a thickness of 4500 Å according to the first embodiment of FIGS. 6–8 is used. FIG. 11 is a graph of the distribution of the intensity of beam for the case where an alternating PSM having an opaque pattern 14 (refer to FIG. 1) with a thickness of 700 Å is used. The masks are exposed using deep ultra-violet (DUV) having a wavelength of 248 nm to transcribe the patterns of 280 nm pitch to wafers.

As shown in FIG. 10, when the WGAPSM of FIGS. 6–8 is used, there is no substantial difference between the intensities $I_B$ and $I_A$ of the beams passed through the shift transparent regions B and the non-shift transparent regions A and no X-effect is generated.

Unlike the WGAPSM, when the mask according to FIG. 1 is used, there is a big difference between the intensities $I_B$ and $I_A$ of the beams passed through the shift transparent regions B and the non-shift transparent regions A, and an X-effect occurs when defocus is 0.3 μm.

FIGS. 12 through 15 are sectional views illustrating a method of fabricating a WGAPSM.

Figure 12:
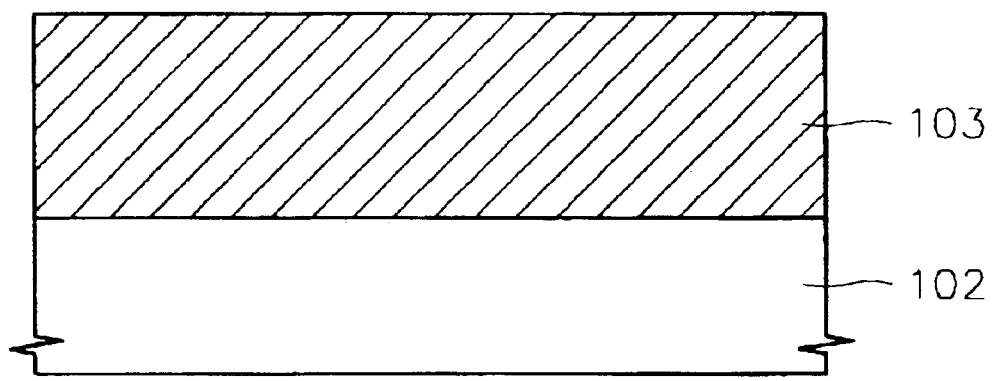
FIGS. 12 through 15 are sectional views of illustrating a method of fabricating the WGAPSM of FIGS. 6–8.

First, a material layer 103 for a waveguide pattern is formed on a mask substrate 102 that is transparent to light of an exposure light source, as shown in FIG. 12. More specifically, the material layer 103 with a predetermined thickness is formed by depositing Cr, Al, MoSi, or CrOx, which has optical transmittance of over 0% and less than 30%.

The thickness of the material layer 103 is determined for a waveguide pattern 104 (refer to FIG. 15) formed of the material layer 103 to guide the high order Fourier components of the beam passing through transparent regions, in particular, the shift transparent regions B at least once. Here, the thickness of the material layer 103 is determined considering the pitch of the waveguide pattern 104 and the wavelength of the exposure light source that will be used for the mask.

For example, if exposure light source has the wavelength of less than 280 nm, and if the pitch of the pattern to be transcribed to a wafer is 280 nm, and the mask will be used for a ¼-scale stepper, then the thickness of the material layer 103 is determined to be 4400 to 4600 Å.

Figure 13:
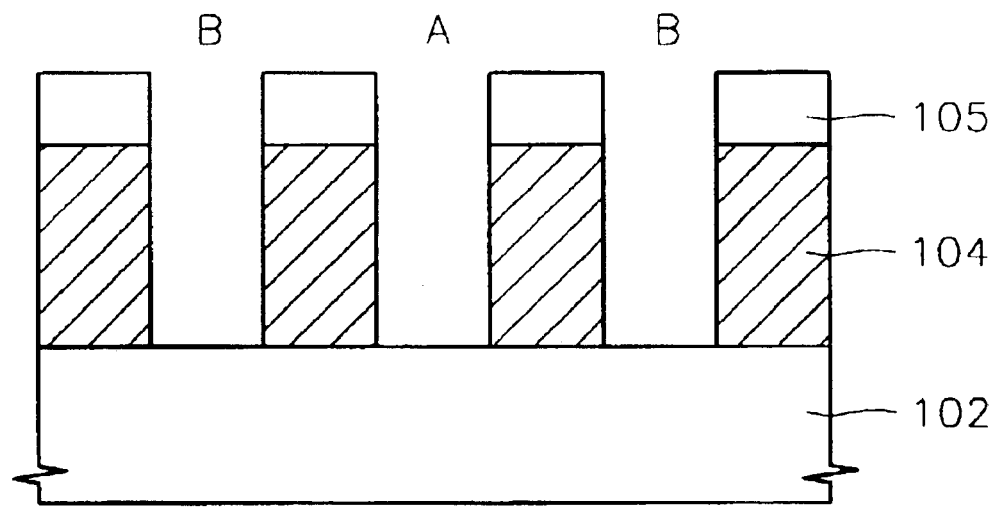

FIG. 13 is a view illustrating a step for forming the waveguide pattern 104. After a photoresist layer is coated on the entire surface of the material layer 103, the photoresist layer is exposed and developed to form a photoresist pattern 105 for exposing regions to be transparent regions. Thereafter, the material layer 103 is etched by using the photoresist pattern 105 as an etch mask, and thus a waveguide pattern 104 having a predetermined pitch is formed to define transparent regions A and B.

Figure 14:
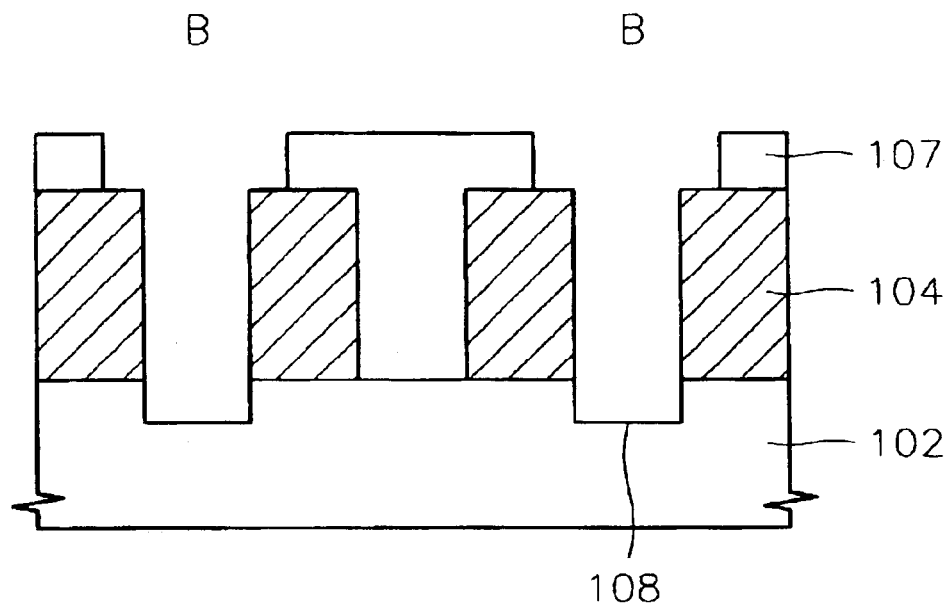

FIG. 14 is a view illustrating a step for forming shift transparent regions B. After the photoresist pattern 105 that has been used for forming the waveguide pattern 104 is removed, a photoresist layer is coated, exposed, and developed to form a photoresist pattern 107 that defines regions to be the shift transparent regions B. The exposed mask substrate 102 is etched for a predetermined depth by using the photoresist pattern 107 and the waveguide pattern 104 as etch masks to form recess regions 108. Thus, the shift transparent regions B are completed. Here, the depth of the recess regions 108 is determined such as to shift the phase of the beam passing through the recess regions 108. The depth of the recess regions 108 is, for example, depth={the wavelength of the exposure light source used for the mask/[2*(refractive index of the substrate−1)]}.

Figure 15:
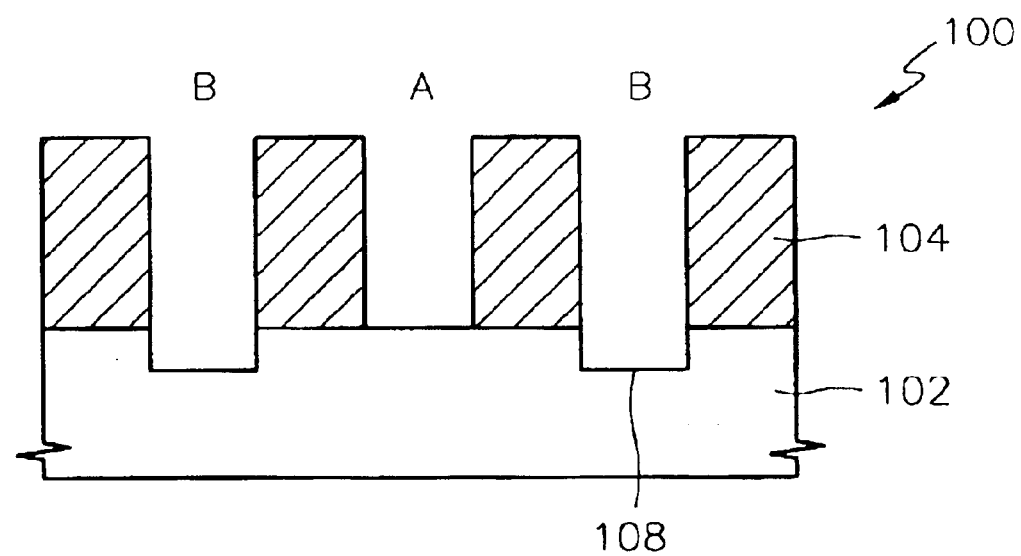

FIG. 15 is a view illustrating a step for completing the WGAPSM 100 according to the first embodiment. By removing the photoresist pattern 107 used for forming the shift transparent regions B, the WGAPSM on which the non-shift transparent regions A and the shift transparent regions B are alternatively arranged while defined by the waveguide pattern 104, is completed.

The WGAPSM as disclosed herein can minimize the error CD and X-effect, which are generally generated in an alternating PSM, and prevent opaque defects in fabricating the WGAPSM. In addition, the WGAPSM has a large phase margin due to the characteristics of the waveguide, so that a margin for controlling the phase is increased to form a proper phase. In particular, an in-phase, i.e., a phase difference of 180 degrees, in the conventional mask is formed by an etching process of the substrate. In this case, the etching process of the substrate is generally performed by a dry etch method, wherein it is difficult to control the etching process precisely and uniformly. Thus, the phase margin for the conventional mask is as small as about 3 degrees, and the error CD and X-effect are likely to happen when the etching process is not precisely controlled. On the other hand, the phase difference for the mask as disclosed herein is set to be 180 degrees by controlling the height of the waveguide. In this case, the height of the waveguide can be adjusted by controlling the deposition thickness of the material layer for the waveguide. Accordingly, the method for forming the phase difference is easier. As a result, the phase margin for a WGAPSM as disclosed herein is as large as about 5 to 6 degrees.

While this invention has been particularly shown and described with reference to preferred embodiments thereof, the preferred embodiments described above are merely illustrative and are not intended to limit the scope of the invention. It will be understood by those skilled in the art that various changes in form and details may be made therein without departing from the spirit and scope of the invention as defined by the appended claims.

What is claimed is:

1. A wave guided alternating phase shift mask (WGAPSM) comprising:
   a substrate that is transparent to light from an exposure light source; and
   a waveguide pattern formed on the substrate to define a plurality of transparent regions that are regularly arranged,
   wherein the transparent regions include shift transparent regions formed of recess regions of the substrate, and non-shift transparent regions alternatively arranged with the shift transparent regions.

2. The WGAPSM of claim 1, wherein a thickness of the waveguide pattern guides high order (i.e., having an order $\leq -2$ and $\geq +2$) Fourier components of wavefronts which pass through the shift transparent regions at least once.

3. The WGAPSM of claim 2, wherein the thickness of the waveguide pattern guides the high order Fourier components of the wavefronts which pass through the shift transparent regions exactly once.

4. The WGAPSM of claim 2, wherein the thickness of the waveguide pattern is determined by a function depending on two independent variables, said variables being a wavelength of the exposure light source and a pitch size of the waveguide pattern.

5. The WGAPSM of claim 1, wherein a depth of the recess regions is determined by an equation of depth={wavelength of the exposure light source/[2*(a refractive index of the substrate−1)]}.

6. The WGAPSM of claim 5, wherein the wavelength of the exposure light source is less than 248 nm, the pitch size of the waveguide pattern is less than 1120 nm, and the thickness of the waveguide pattern is 4400 to 4600 Å.

7. The WGAPSM of claim 1, wherein the waveguide pattern is formed of a material having a transmittance of over 0% and less than 30% for the exposure light source.

8. The WGAPSM of claim 1, wherein the waveguide pattern defines one of a line and space pattern and an opening pattern in a cell array region of a semiconductor memory device.

9. A method of fabricating of a WGAPSM comprising:

forming a material layer for a waveguide pattern on a substrate that is transparent to light from an exposure light source;

forming the waveguide pattern adapted to define a plurality of transparent regions by patterning the material layer;

forming on the substrate a resist pattern adapted to expose the transparent regions to be shift transparent regions; and etching the substrate by using the resist pattern and the waveguide pattern as etch masks to form recess regions, so as to complete a plurality of shift transparent regions formed of the recess regions and a plurality of non-shift transparent regions alternatively arranged with the shift transparent regions.

10. The method of claim 9, wherein a thickness of the material layer guides high order (i.e., having an order $\leq -2$ and $\geq +2$) Fourier components of wavefronts which pass through the shift transparent regions at least once.

11. The method of claim 10, wherein the thickness of the material layer guides the high order components of the wavefronts which pass through the shift transparent regions exactly once.

12. The method of claim 10, wherein the thickness of the material layer is determined by a function having two independent variables, said variables being a wavelength of the exposure light source and a pitch size of the waveguide pattern.

13. The method of claim 9, wherein a depth of the recess regions is determined by an equation of depth={wavelength of the exposure light source used for the mask/[2*(the refractive index of the substrate−1)]}.

14. The method of claim 13, wherein the wavelength of the exposure light source is less than 248 nm, the pitch size of the waveguide pattern is less than 1120 nm, and the thickness of the waveguide pattern is 4400 to 4600 Å.

15. The method of claim 9, wherein the waveguide pattern is formed of a material having a transmittance of over 0% and less than 30% for the exposure light source.

16. The method of claim 9, wherein the waveguide pattern defines one of a line and space pattern and an opening pattern in a cell array region of a semiconductor memory device.

* * * * *